United States Patent
Hwang et al.

(10) Patent No.: US 8,754,453 B2
(45) Date of Patent: Jun. 17, 2014

(54) CAPACITIVE PRESSURE SENSOR AND METHOD FOR MANUFACTURING SAME

(75) Inventors: Hak-In Hwang, Seoul (KR); Dae-Sung Lee, Yongin-si (KR); Kyu-Sik Shin, Seoul (KR)

(73) Assignee: Korea Electronics Technology Institute, Gyeonggi-Do (KR)

(*) Notice: Subject to any disclaimer, the term of this patent is extended or adjusted under 35 U.S.C. 154(b) by 0 days.

(21) Appl. No.: 13/814,304

(22) PCT Filed: Jul. 21, 2011

(86) PCT No.: PCT/KR2011/005364
§ 371 (c)(1),
(2), (4) Date: Feb. 5, 2013

(87) PCT Pub. No.: WO2012/020930
PCT Pub. Date: Feb. 16, 2012

(65) Prior Publication Data
US 2013/0126994 A1  May 23, 2013

(30) Foreign Application Priority Data
Aug. 13, 2010  (KR) .................. 10-2010-0078321

(51) Int. Cl.
*H01L 21/48*  (2006.01)

(52) U.S. Cl.
USPC  257/252; 257/72; 257/E21.506; 257/E21.575; 257/E25.013; 257/E29.324; 438/50; 438/53; 438/419

(58) Field of Classification Search
USPC ............... 257/72, 252, E21.506, 575, 614, 257/23.023, 25.013, 29.324; 438/50, 53, 438/419
See application file for complete search history.

(56) References Cited

U.S. PATENT DOCUMENTS

| 4,612,599 | A  | * | 9/1986  | Ziegler ................. 361/283.1 |
| 6,877,383 | B2 | * | 4/2005  | Horie et al. ................ 73/754 |
| 8,163,586 | B2 | * | 4/2012  | Rey et al. ................... 438/53 |
| 2003/0015040 | A1 | * | 1/2003  | Ishio et al. ................. 73/718 |
| 2003/0019299 | A1 | * | 1/2003  | Horie et al. ................ 73/718 |
| 2003/0215974 | A1 | * | 11/2003 | Kawasaki et al. ............ 438/50 |
| 2004/0238821 | A1 | * | 12/2004 | Yang .......................... 257/72 |
| 2006/0170012 | A1 | * | 8/2006  | Larmer et al. ............ 257/252 |
| 2007/0249082 | A1 | * | 10/2007 | Hanaoka et al. ............. 438/53 |
| 2010/0148341 | A1 | * | 6/2010  | Fuji et al. ................. 257/686 |
| 2012/0062245 | A1 | * | 3/2012  | Bao et al. .................. 324/661 |
| 2013/0207208 | A1 | * | 8/2013  | Graham et al. ............ 257/419 |

FOREIGN PATENT DOCUMENTS

| JP | 63-250865   | 10/1988 |
| JP | 11-223569   | 8/1999  |
| JP | 2009-296569 | 12/2009 |

OTHER PUBLICATIONS

International Search Report mailed Mar. 7, 2012 for PCT/KR2011/005364.

* cited by examiner

*Primary Examiner* — Michael Lebentritt
(74) *Attorney, Agent, or Firm* — Lowe Hauptman & Ham, LLP

(57) ABSTRACT

The capacitive pressure sensor comprises: a substrate functioning as a lower electrode; a first insulating film formed on the substrate; a cavity formed on the first insulating film; a second insulating film formed on the first insulating film to have openings communicated with the cavity and to cover the cavity; a sealing film formed of a conductive material to seal the openings and to extend partially into the cavity through the openings; and an upper electrode formed on the second insulating film to be electrically separated from the sealing film and to overlap the cavity.

5 Claims, 6 Drawing Sheets

- PRIOR ART -

(a)　　　　　　　　　(b)

CAPACITIVE PRESSURE SENSOR AND METHOD FOR MANUFACTURING SAME

TECHNICAL FIELD

The present invention relates to a semiconductor pressure sensor and a method for manufacturing the same, and more particularly, to a capacitive pressure sensor which minimizes parasitic capacitance acting as noise in any other areas than a cavity during pressure detection and enables to realize a micro-sensor, and a method for manufacturing the same.

BACKGROUND ART

Research has been actively conducted for semiconductor pressure sensors using micromachining technology which is the micro-fabrication technology using the semiconductor fabricating process. Semiconductor pressure sensors which are micro-fabricated by micromachining technology are widely used in fields, such as automobile systems, industrial control, environmental monitoring, biomedical diagnosis, etc.

Based on pressure sensing principles, semiconductor pressure sensors used as devices to measure absolute pressure or relative pressure are classified into a metal pressure sensor in a strain gauge type, a piezoresistive pressure sensor, a piezoelectric pressure sensor, a MOSFET pressure sensor, a piezojunction pressure sensor, an optical pressure sensor and a capacitive pressure sensor. Among these pressure sensors, except for the metal pressure sensor they are manufactured by micromachining technology using silicon, a semiconductor substance.

In a capacitive pressure sensor, a parallel plate capacitor is positioned between a silicon thin film membrane and a support. This capacitive pressure sensor uses the principle that the capacitance value varies as a gap between two electrodes changes by the deflection of a silicon thin film diaphragm (that is, deformation of the membrane) according to pressure applied from the outside.

The above-described capacitive pressure sensor, which detects the capacitance value between two electrodes by using the deformation of the membrane, has several tens to several hundreds of times higher value (that is, higher sensitivity) in comparison with a piezoresistive pressure sensor. It also has excellent stability (that is, lower temperature coefficient and stronger structure) and low power consumption (that is, lower power use).

FIG. 1 is a cross-sectional view illustrating a conventional capacitive pressure sensor.

In FIG. 1, the conventional capacitive pressure sensor includes a cavity 20 formed on a substrate 10. The cavity 20 is formed on a silicon oxide film 14 formed on the substrate 10. A silicon oxide film 32 having openings 32a is formed over the cavity 20.

A low resistance layer 12 functioning as a lower electrode is formed within the substrate 10 under the silicon oxide film 14. A polycrystalline silicon film 34 functioning as an upper electrode is formed on the silicon oxide film so as to partially cover the silicon oxide film 32. The low resistance layer 12 and the polycrystalline silicon film 34 are electrically separated from each other and connected to exposed contact electrodes 50, 51.

A silicon oxide film 36 is formed on the polycrystalline silicon film 34 relatively thickly so as to bury the openings 32a of the silicon oxide film 32 and between patterns of the polycrystalline silicon film 34. A silicon nitride film 40 is formed on the silicon oxide film 36. The silicon nitride film 40 has the tensile stress property to compensate the compressive stress of the silicon oxide film 36.

However, in the aforementioned conventional capacitive pressure sensor, since the polycrystalline silicon film 34 functioning as the upper electrode is formed to expand to the silicon oxide film 14 over the cavity 20, a parallel plate capacitor (see "A" in FIG. 1) is formed between the polycrystalline silicon film 34 and the low resistance layer 12 functioning as a lower electrode. Accordingly, during the process of detecting the capacitance value according to the deformation of a membrane, the capacitance value by the parallel plate capacitor acts as noise, making it substantially impossible to detect micro-pressure.

Moreover, in the conventional capacitive pressure sensor, since the silicon oxide film 36 needs to be vapor-deposited relatively thickly in order to cover the polycrystalline silicon film 34 functioning as the upper electrode and to bury the openings 32a of the silicon oxide film 32 formed under the polycrystalline silicon film 34, there is a certain limit in realizing a micro-sensor for sensing micro-capacitance. In addition, since the silicon nitride film 40 needs to be additionally formed on the silicon oxide film 36 as "B" indicated in FIG. 1, the thickness increases in the direction where pressure is applied and therefore it is more difficult to realize a micro-sensor.

DISCLOSURE

Technical Problem

Therefore, it is an object of the present invention to solve the above problems of the conventional capacitive pressure sensor and to provide a capacitive pressure sensor which minimizes parasitic capacitance acting as noise in any other areas than a cavity during pressure detection so as to realize a micro-sensor, and a method for manufacturing the same.

Technical Solution

In accordance with an aspect of the present invention, there is provided a capacitive pressure sensor comprising: a substrate functioning as a lower electrode, a first insulating film formed on the substrate, a cavity formed on the first insulating film, a second insulating film formed on the first insulating film to have openings communicating with the cavity and to cover the cavity, a sealing film formed of a conductive material to seal the openings and the cavity through the openings, and an upper electrode formed on the second insulating film to be electrically separated from the sealing film and to overlap the cavity.

Preferably, the sealing film may be formed in an anchor shape.

In accordance with another aspect of the present invention, there is provided a method for manufacturing a capacitive pressure sensor, comprising the steps of: forming a first insulating film on a substrate, forming a sacrificial layer on the first insulating film, forming a second insulating film on the first insulating film to cover the sacrificial layer, forming an upper electrode on the second insulating film, forming openings by partially etching the second insulating film, forming a cavity by removing the sacrificial layer through the openings, forming a sealing film with a conductive material to seal the openings and the cavity through the openings.

Preferably, the sealing film may be formed in an anchor shape, to be electrically separated from the upper electrode.

Preferably, the etching may be carried out by using xenon difluoride gas ($XeF_2$).

Advantageous Effects

In accordance with the present invention, after the cavity is formed, the sealing film is formed of a conductive material in the anchor shape at both sides of the cavity and the upper electrode is formed to be electrically separated from the sealing film and to overlap the cavity. Since the cavity area which has a substantial affect upon pressure detection is limited as a specific area by the sealing film, parasitic capacitance acting as noise in any other areas than the cavity during the pressure detection is minimized, to realize a micro-sensor.

Furthermore, in accordance with the present invention, since the sealing film extending partially into the cavity does not overlap the cavity area which has a substantial affect upon the pressure detection and it floats in the anchor shape, the thickness of the pressure sensor generally decreases in comparison with a conventional one, to realize a micro-sensor.

DESCRIPTION OF DRAWINGS

These and other aspects and advantages of the present invention will become apparent and more readily appreciated from the following description of the embodiment(s), taken in conjunction with the accompanying drawings, in which.

DESCRIPTION OF NUMBERS FOR CONSTITUENTS IN DRAWINGS

Figure 1:
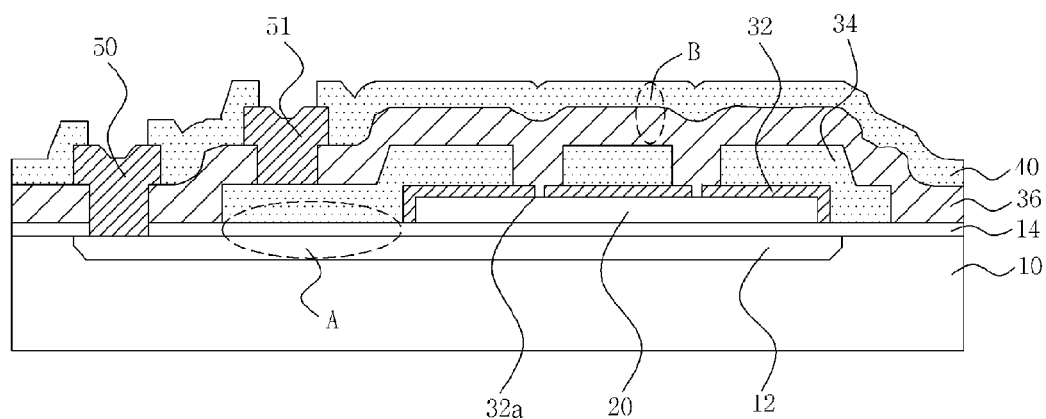
FIG. 1 is a cross-sectional view illustrating a conventional capacitive pressure sensor.

110: substrate
111: first insulating film
112: sacrificial layer
113: second insulating film
114: conductive film
115: upper electrode
116: cavity
117: sealing film

PREFERRED EMBODIMENTS

The advantages and characteristics of the present invention and the way(s) to achieve them will become apparent from the following description of the embodiment(s) with reference to the accompanying drawings. This invention may, however, be embodied in many alternate forms and should not be construed as limited to only the embodiment(s) set forth herein.

The embodiments are provided so that this disclosure will be complete and will fully convey the scope of the invention to those skilled in the art. This invention is defined by the scope of the claim(s). Therefore, well-known constituent elements, operations and techniques are not described in detail in the embodiment(s), to prevent the present invention from being obscurely interpreted.

Like numbers refer to like elements having like functions and actions throughout the specification and drawings. The terms used herein are for the purpose of describing the embodiment(s) only and are not intended to limit the invention. As used herein, the singular forms are intended to include the plural forms as well, unless the context clearly indicates otherwise. The terms "comprises", "comprising", "includes" and/or "including", when used herein, specify the presence of stated components, operations and/or steps but do not precluded the presence or addition of one or more other components, operations, steps and/or groups thereof.

In the drawings, the thicknesses of layers and regions are exaggerated for clarity. When an element, such as layer or region, is described as being positioned "on" another element, the element directly contacts with the other element or there may exist other elements interposed between the two elements. Like numbers refer to like layers.

Unless otherwise defined, all terms (including technical and scientific terms) used herein have the same meaning as commonly understood by one having ordinary knowledge in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the technical characteristics of the present invention will be specifically described with reference to the accompanying drawings.

Figure 2:
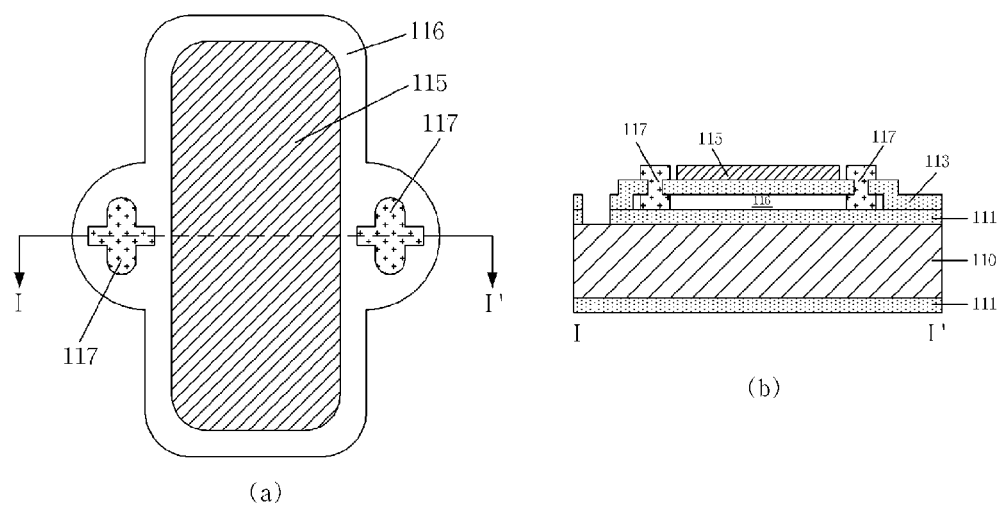
FIG. 2 is a cross-sectional view illustrating a capacitive pressure sensor according to one embodiment of the present invention.

FIG. 2 illustrates a capacitive pressure sensor according to an embodiment of the present invention. In FIG. 2, (a) is a plan view and (b) is a cross-sectional view taken along line "I-I" of (a).

In FIG. 2, the capacitive pressure sensor according to the present invention comprises: a substrate 110, a first insulating film 111 formed on the substrate 110, a cavity 116 formed on the first insulating film 111, a second insulating film 113 formed on the first insulating film 111 so as to have openings communicating with the cavity 116 and to cover the cavity 116, a sealing film 117 formed to seal the openings and to extend partially into the cavity 116 through the openings, and an upper electrode 115 formed on the second insulating film 113 so as to be electrically separated from the sealing film 117 and to overlap the cavity 116.

The sealing film 117 is formed in an anchor shape to seal the openings of the second insulating film 113 and the cavity 116 through the openings as explained below(and not to overlap the upper electrode 115 if possible). Accordingly, the actual area which substantially affects the capacitance value upon pressure detection is limited by the sealing film 117. This sealing film 117 does not overlap the upper electrode 115 and is electrically separated from the upper electrode 115 so as to exist in a floating state. Preferably, the sealing film 117 may be formed by using a conductive material instead of an insulating material so as not to affect the capacitance value upon the pressure detection.

The sealing film 117 supports a membrane formed by the first insulating film 111, the cavity 116 and the second insulating film 113. In other words, since the sealing film 117 is formed in a greater width than each of the openings (113a in FIG. 11) in the cavity 116, as a result the second insulating film 113 partially overlaps an end part of the sealing film 117. Accordingly, the second insulating film 113 is prevented from collapsing by somewhat reducing the pressure applied to the second insulating film 113 during the pressure detection process, Consequently, it is possible to prevent the membrane from being damaged by the collapse of the second insulating film 113.

FIGS. 3 through 14 are process cross-sectional views illustrating a method for manufacturing a capacitive pressure sensor according to another embodiment of the present invention.

Figure 3:
FIGS. 3 through 14 are process cross-sectional views illustrating a method for manufacturing a capacitive pressure sensor according to one embodiment of the present invention.

In FIG. 3, a low resistive substrate 110 is prepared. The substrate 110 is formed of a semiconductor material. Preferably, the semiconductor material may be single crystalline silicon. However, the semiconductor materials, such as silicon carbide (SiC) and gallium arsenide (GaAs), may also be used. The present invention is not limited to these semiconductor materials.

Figure 4:
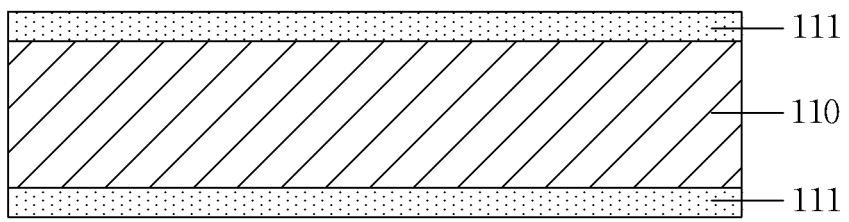

In FIG. 4, a first insulating film 111 is formed on the top and bottom sides of the substrate 110. Preferably, the first insulating film 111 may be a silicon nitride film (SiN) using a LPCVD (low pressure chemical vapor deposition) process. However, the present invention is not limited to this insulating film material.

Figure 5:
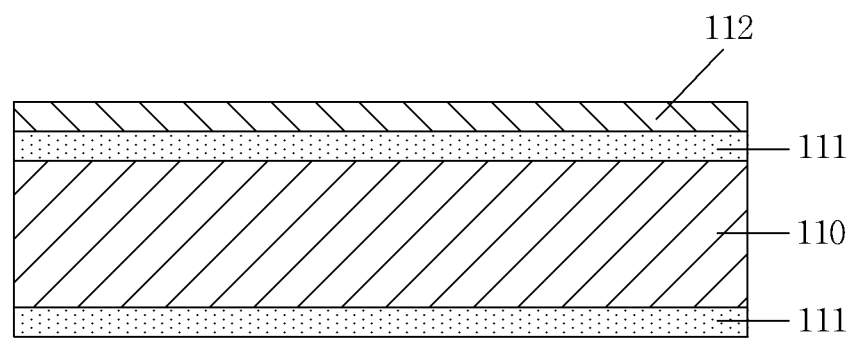

In FIG. 5, a sacrificial layer 112 is formed on the first insulating film 11 which is formed on the top side of the substrate 110. The sacrificial layer 112 is formed of a substance having high etching selectivity to the first insulating film 111. Preferably, the sacrificial layer 112 may be a polycrystalline silicon film. However, a silicon dioxide ($SiO_2$) film may be formed. The present invention is not limited to this sacrificial layer material.

Figure 6:
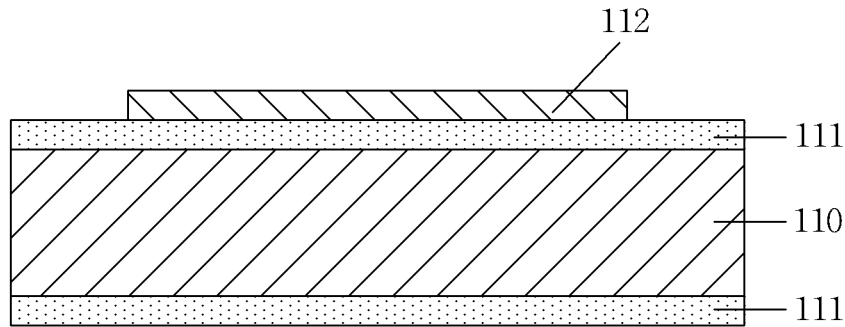

In FIG. 6, a sacrificial layer pattern is formed by selectively etching the sacrificial layer 112. A process of etching the sacrificial layer 112 is performed by using a dry or wet etching process. Preferably, the dry etching process may be performed. The sacrificial layer pattern is formed in a greater region than a cavity (to be later formed).

Figure 7:
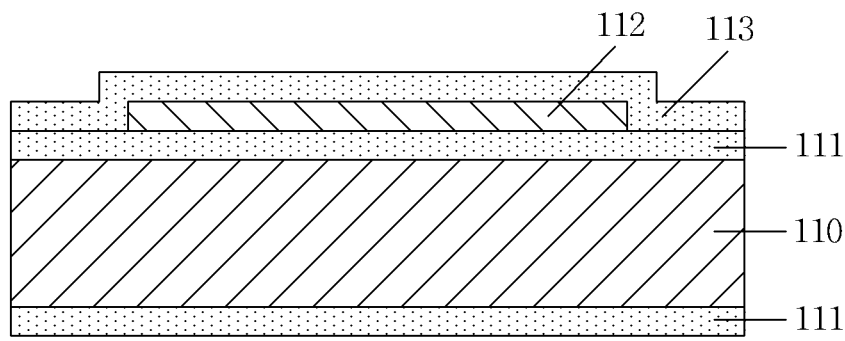

In FIG. 7, a second insulating film 113 is formed on the first insulating film 111 including the sacrificial layer 112. The second insulating film 113 is formed of the same material as the first insulating layer 111. Preferably, the second insulating film 113 may be a silicon nitride (SiN) film. Together with the first insulating film 111, the second insulating film 113 functions as an outer wall of the cavity (to be later formed) after the sacrificial layer 112 is removed.

Figure 8:
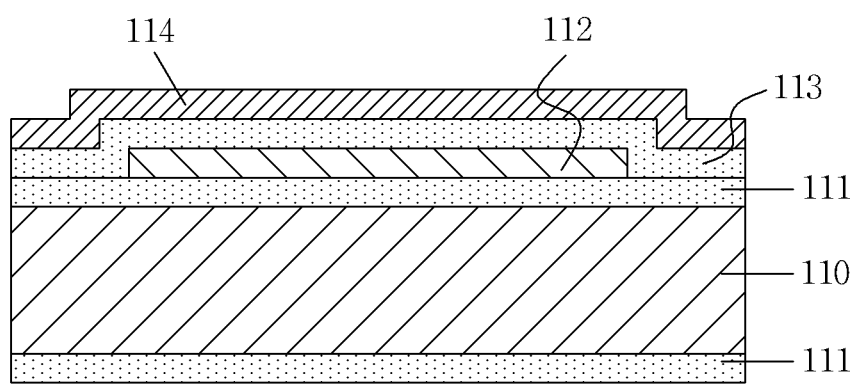

In FIG. 8, a conductive film 114 is formed on the second insulating film 113. The conductive film 114 may be formed of any one selected from transition metals. Preferably, the conductive film 114 may be formed of any one of polycrystalline silicon doped with impurity ions, copper (Cu), aluminum (Al), tungsten (W) and platinum (Pt). More preferably, the conductive film 114 in this invention may be formed of aluminum (Al).

Figure 9:
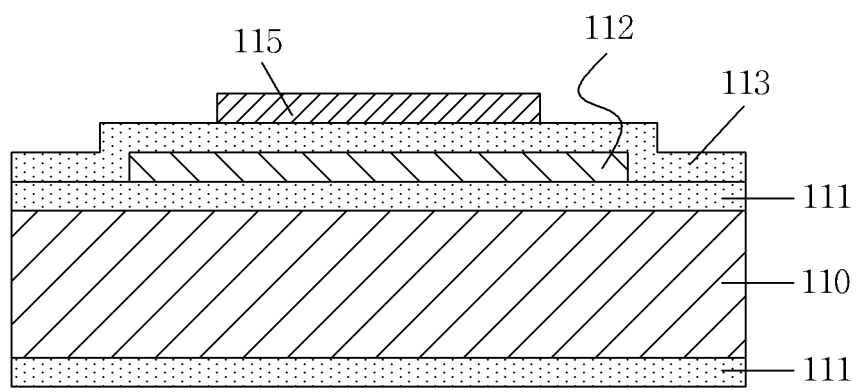

In FIG. 9, an upper electrode 115 is formed by etching the conductive film 114. A dry or wet etching process may be used. The upper electrode 115 is formed to be electrically separated from a sealing film (to be later formed) and to overlap at least partially the cavity (to be later formed).

Figure 10:
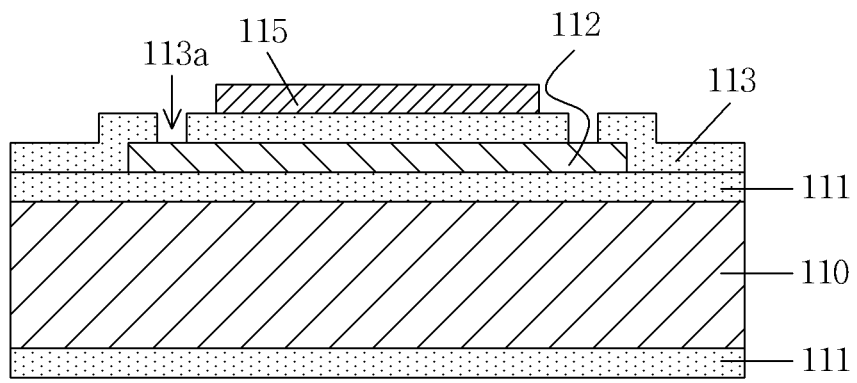

In FIG. 10, the openings (113a) are formed by partially etching the second insulating film 113 so that the sacrificial film 112 is partially exposed. The openings are formed at both sides of the upper electrode 115 and spaced apart, at regular intervals, from the upper electrode 115. An etching process for the openings 113a uses a RIE (reactive ion etching) process.

Figure 11:
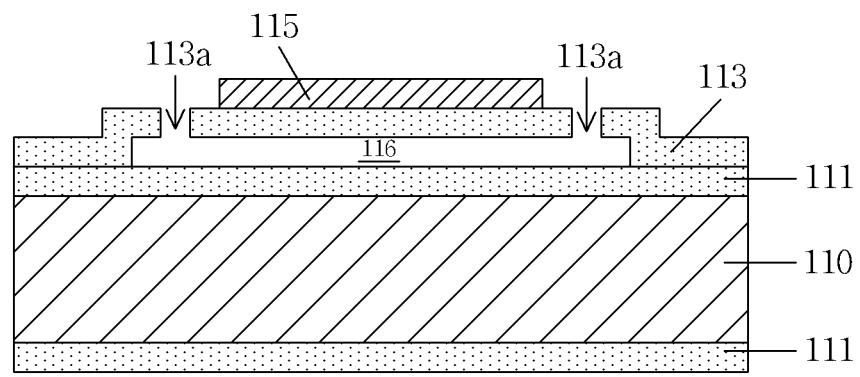

In FIG. 11, the sacrificial layer 112 being exposed through the openings 113a is removed by an etching process using xenon difluoride ($XeF_2$) gas, thereby the cavity 116 is formed to expand in the horizontal direction on the cross-section shown in FIG. 11. The etching process using the xenon difluoride ($XeF_2$) gas enables to stably and selectively remove only the sacrificial film 112 by using the xenon difluoride ($XeF_2$) gas which has high etch selectivity between the polycrystalline silicon film (sacrificial layer) and the silicon nitride film (first and second insulating films). The etching process using the xenon difluoride ($XeF_2$) gas may be performed by adding argon (Ar) gas to increase an etching speed.

Figure 12:
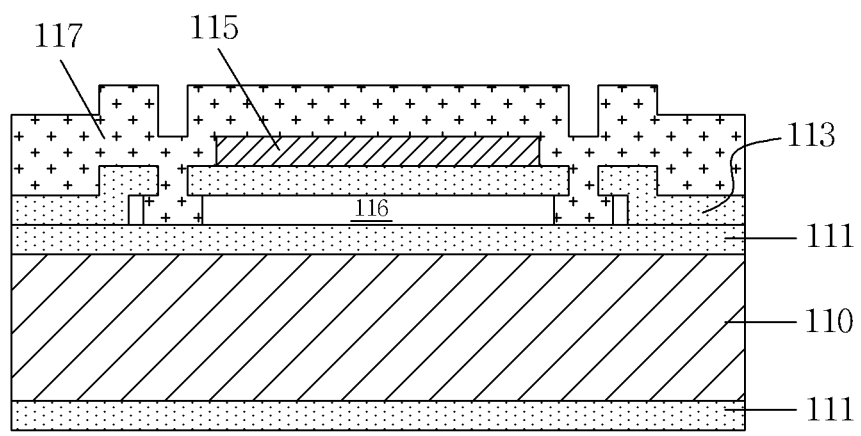

In FIG. 12, a sealing film 117 is formed so that the openings 112a are buried. Since the sealing film 117 is formed to seal the openings 113a and to extend partially into the cavity 116 through the openings 113a (and not to overlap the upper electrode if possible), the actual areas substantially affecting the pressure detection are limited by the sealing film 117. Preferably, the sealing film 117 may be formed of a conductive material so as not to have an influence on the capacitance value upon the pressure detection. This is because, when the sealing film 117 is formed of the conductive material, parasitic capacitance formed by the sealing film 117 may have an influence on the actual capacitance value detected upon the pressure detection.

Figure 13:
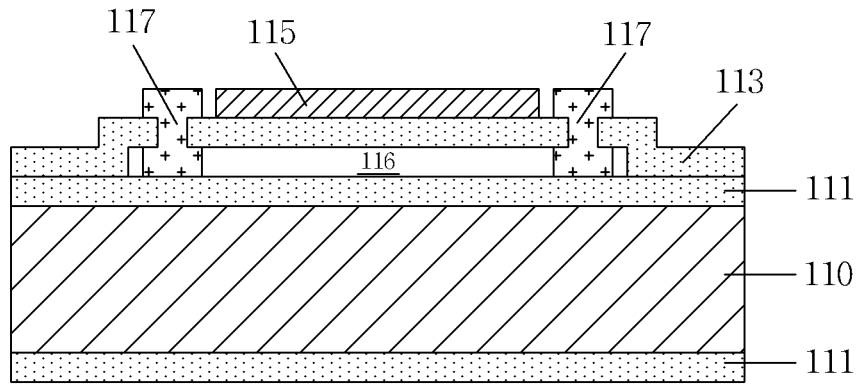

In FIG. 13, the upper electrode 115 and the sealing film 117 are electrically separated from each other by etching the sealing film 117 formed on the upper electrode 115. Accordingly, the sealing film 117 is spaced apart from the upper electrode 115, to remain on the second insulating film 113, within the openings 113a and within the cavity 16. Therefore, the sealing film 117 in an anchor shape passes through the openings 113a and is fixed to the cavity 116, so that it exists in a floating state being electrically separated from the upper electrode 115.

Figure 14:
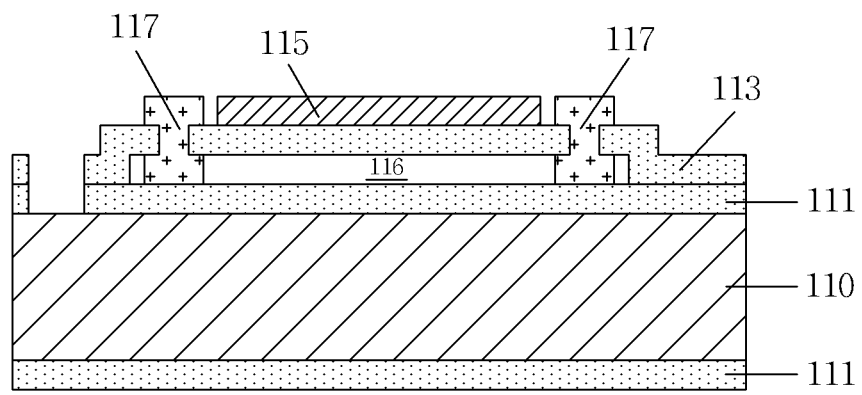

In FIG. 14, the first and second insulating films 111, 113 are etched by the RIE process, to expose the substrate 110 functioning as a lower electrode. Subsequently, it is connected to an outside terminal by wire bonding.

The invention has been described using a preferred embodiment(s). However, it is to be understood that the scope of the invention is not limited to the disclosed embodiment(s). The scope of the claims, therefore, should be accorded the broadest interpretation so as to encompass all various modifications and similar arrangements within the capabilities of persons skilled in the art using presently known or future technologies and equivalents.

The invention claimed is:

1. A capacitive pressure sensor, comprising:
a substrate defining a lower electrode;
a first insulating film formed on the substrate;
a second insulating film formed on the first insulating film, wherein the second insulating film has openings;
a cavity formed between the first insulating film and the second insulating film;
sealing films formed of a conductive material, wherein the sealing films seal the openings, and each of the sealing films is extended partially into the cavity through the openings; and
an upper electrode formed on the second insulating film to be electrically and physically separated from the sealing films and the first insulating film, the upper electrode is overlapped with the cavity.

2. The capacitive pressure sensor according to claim 1, wherein the sealing film is formed in an anchor shape.

3. A method for manufacturing a capacitive pressure sensor, comprising the steps of:
forming a first insulating film on a substrate;
forming a sacrificial layer on the first insulating film;
forming a second insulating film on the first insulating film to cover the sacrificial layer;
forming an upper electrode on the second insulating film;
forming openings by partially etching the second insulating film;

forming a cavity by removing the sacrificial layer through the openings; and forming a sealing film by using a conductive material to seal the openings and part of the cavity.

4. The method for manufacturing a capacitive pressure sensor according to claim 3, wherein, in the forming of the sealing film, the sealing film is formed in an anchor shape, to be electrically separated from the upper electrode.

5. The method for manufacturing a capacitive pressure sensor according to claim 3, wherein the forming openings by partially etching the second insulating film is performed by using xenon difluoride ($XeF_2$) gas.

* * * * *